(12) United States Patent
Abbott, Jr. et al.

(10) Patent No.: US 8,860,305 B2
(45) Date of Patent: Oct. 14, 2014

(54) METHODS FOR FORMING FRITTED COVER SHEETS WITH MASKS AND GLASS PACKAGES COMPRISING THE SAME

(75) Inventors: John S. Abbott, Jr., Painted Post, NY (US); Kelvin Nguyen, Rochester, NY (US); Lu Zhang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 1408 days.

(21) Appl. No.: 12/500,119

(22) Filed: Jul. 9, 2009

(65) Prior Publication Data

US 2011/0008593 A1  Jan. 13, 2011

(51) Int. Cl.
*B32B 3/10* (2006.01)
*C03C 17/34* (2006.01)
*C03C 27/06* (2006.01)
*C03C 17/40* (2006.01)
*C03C 8/24* (2006.01)
*H01L 51/52* (2006.01)
*C03C 17/09* (2006.01)

(52) U.S. Cl.
CPC ........... *C03C 27/06* (2013.01); *C03C 2218/328* (2013.01); *C03C 2218/355* (2013.01); *C03C 2218/365* (2013.01); *C03C 17/40* (2013.01); *C03C 2217/252* (2013.01); *C03C 2218/34* (2013.01); *C03C 8/24* (2013.01); *C03C 2217/253* (2013.01); *H01L 51/5246* (2013.01); *C03C 17/09* (2013.01)
USPC .............. 313/512; 313/507; 445/24; 428/203

(58) Field of Classification Search
USPC .................... 313/498–512; 315/169.1, 169.3; 438/26–29, 34, 82; 427/66, 532–535, 427/539; 445/24–25
See application file for complete search history.

(56) References Cited

U.S. PATENT DOCUMENTS

| | | | |
|---|---|---|---|
| 8,505,337 B2 * | 8/2013 | Burgess et al. | 65/43 |
| 2002/0098708 A1 * | 7/2002 | Kumihashi et al. | 438/714 |
| 2007/0170861 A1 * | 7/2007 | Lee et al. | 313/512 |
| 2008/0138653 A1 * | 6/2008 | Lee et al. | 428/690 |
| 2008/0213482 A1 * | 9/2008 | Logunov | 427/259 |
| 2009/0057657 A1 * | 3/2009 | Lee et al. | 257/40 |
| 2009/0146557 A1 * | 6/2009 | Shinto et al. | 313/504 |
| 2010/0159218 A1 * | 6/2010 | Yum | 428/201 |

FOREIGN PATENT DOCUMENTS

| | | |
|---|---|---|
| EP | 1 814 177 | 8/2007 |
| EP | 1 814 178 | 8/2007 |
| EP | 1 933 398 | 6/2008 |
| EP | 1933398 A2 | 6/2008 |

(Continued)

OTHER PUBLICATIONS

PCT—Notification of Transmittal of the International Search Report and the Written Opinion of the International Searching Authority, or the Declaration—Date: Jan. 5, 2011 (10 pages).

(Continued)

*Primary Examiner* — Tracie Y Green
(74) *Attorney, Agent, or Firm* — Kevin M. Able

(57) ABSTRACT

A method for forming a fritted cover sheet for sealing a glass package includes providing a transparent substrate having a sealing surface and a backing surface and forming at least one mask on one of the sealing surface of the substrate or the backing surface of the substrate. A sealing frit may be formed on the sealing surface of the substrate such that the at least one mask is positioned adjacent a perimeter defined by the sealing frit.

15 Claims, 5 Drawing Sheets

(56) References Cited

FOREIGN PATENT DOCUMENTS

| JP | 2006338948 A | 12/2006 |
| JP | 2007227343 A | 9/2007 |
| JP | 2008147151 A | 6/2008 |
| WO | WO 2007/067384 | 6/2007 |
| WO | WO2008106123 A1 | 9/2008 |

OTHER PUBLICATIONS

CP1120005P/ME—State Intellectual Property Office of the People's Republic of China—First Office Action, Date of Issue: Dec. 4, 2013 (9 pages).

Office Action filed in Japanese Patent Application No. 2012-519726, dispatch date of Mar. 4, 2014.

\* cited by examiner

METHODS FOR FORMING FRITTED COVER SHEETS WITH MASKS AND GLASS PACKAGES COMPRISING THE SAME

BACKGROUND

1. Field

The present specification generally relates to fritted cover sheets for frit sealing glass substrates and, more specifically, to fritted cover sheets with masks and methods for making the same.

2. Technical Background

U.S. Pat. No. 6,998,776 discloses a method for frit sealing a glass package using a radiation-absorbing glass frit. As generally described in U.S. Pat. No. 6,998,776, a glass frit is deposited in a closed line (typically in the shape of a picture frame) on a first glass substrate and heated to pre-sinter the frit. The first glass substrate is then placed overtop a second glass substrate with the frit disposed between the first and second substrates. A laser beam is subsequently traversed over the frit (typically through one or both of the substrates) to heat and melt the frit, creating a hermetic seal between the substrates.

One use for such a glass package is in the manufacture of organic light emitting diode (OLED) display devices. An exemplary OLED display device comprises a first glass substrate on which is deposited a first electrode material, one or more layers of organic electroluminescent material, and a second electrode material. One characteristic of the organic electroluminescent material is its low damage threshold with respect to heat. That is, the temperature of the electroluminescent material must generally be maintained below about 100° C. to avoid degradation of the material and subsequent failure of the display device. Thus, the sealing operation must be performed in a manner which avoids heating of the electroluminescent material.

A typical scenario for heating the frit to seal OLED display devices includes the use of a laser beam (or other radiant energy source capable of heating the frit to its melting temperature) which is at least as wide as the line of frit deposited on the first substrate. As the frit is heated, care must be taken so as not to inadvertently contact the electroluminescent material with the laser beam. To facilitate heating of the frit while at the same time avoiding undue heating of the electroluminescent material, a mask is sometimes used to ensure the laser beam does not stray from the frit. The mask is placed over the two substrates having the frit sandwiched between them, and the mask and frit are irradiated with the beam. Light from the laser (or other source) which is incident on the mask is either absorbed by the mask or, more preferably, reflected off from the mask as heating of the mask can decrease the useful life of the mask.

As the size of display substrates increase in size the ability to produce masks with the requisite accuracy to prevent inadvertent heating of the electroluminescent material has become challenging. This is particularly important since much of the value of the display is inherent in the deposited electroluminescent materials and other supporting structures (e.g. electrodes) within the device, and error during the frit sealing process has large financial consequences.

SUMMARY

According to one embodiment, a method for forming a fritted cover sheet for sealing a glass package includes providing a transparent substrate having a sealing surface and a backing surface and forming at least one mask on one of the sealing surface of the substrate or the backing surface of the substrate. A sealing frit may be formed on the sealing surface of the substrate such that the at least one mask is positioned adjacent a perimeter defined by the sealing frit.

In another embodiment, a method for forming a glass package includes providing a first transparent substrate and a second transparent substrate. A mask may be formed on one of a sealing surface of the first transparent substrate or a backing surface of the first transparent substrate. A sealing frit may be formed on the sealing surface of the first transparent substrate such that the inner mask is located within a perimeter defined by the sealing frit. The first transparent substrate may be aligned on the second transparent substrate such that the sealing frit is disposed between the first transparent substrate and the second transparent substrate. Radiant energy may be directed onto the sealing frit through the backing surface of the first transparent substrate to heat the sealing frit and thereby hermetically seal the first transparent substrate to the second transparent substrate.

In another embodiment, a glass package includes as fritted cover sheet and a glass substrate. The fritted cover sheet may include a sealing frit and a mask, wherein the sealing frit is positioned on a sealing surface of the fritted cover sheet and defines a perimeter and the mask is positioned on one of the sealing surface of the fritted cover sheet or a backing surface of the fritted cover sheet and is located within the perimeter defined by the sealing frit. The fritted cover sheet may be positioned on the glass substrate such that the sealing frit is disposed between the glass substrate and the fritted cover sheet, the sealing frit forming a hermetic seal between the glass substrate and the fritted cover sheet.

Additional features and advantages of the invention will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
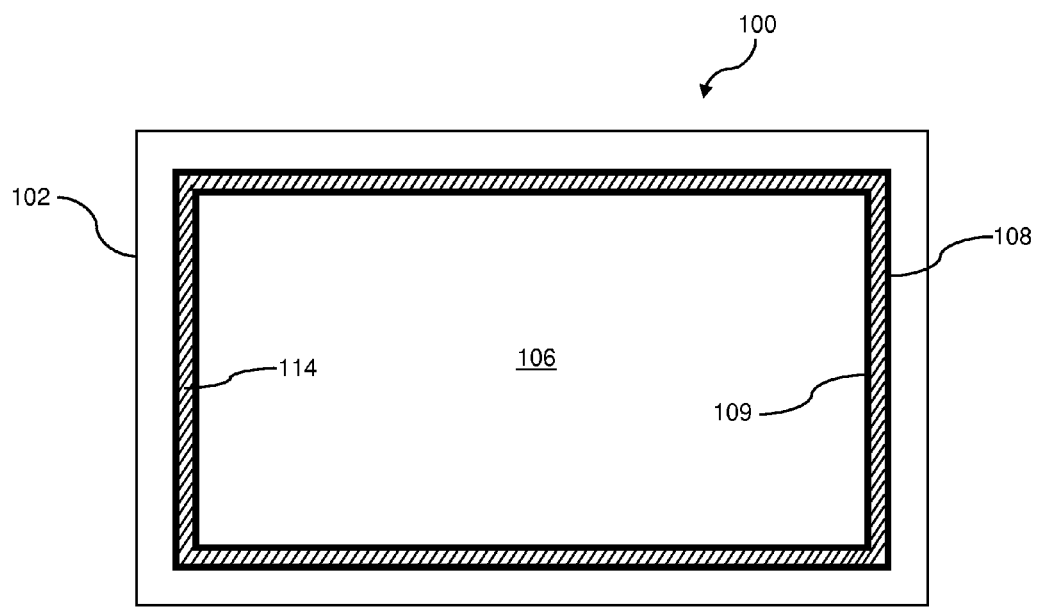
FIG. 1 depicts a fritted cover sheet comprising a substrate with an inner mask, an outer mask and a sealing frit positioned between the inner mask and outer mask according to one or more embodiments shown and described herein.

Reference will now be made in detail to various embodiments of fritted cover sheets for use in sealing glass packages. Whenever possible, the same reference numerals will be used throughout the drawings to refer to the same or like parts. One embodiment of a fritted cover sheet is shown in FIG. 1, and is designated generally throughout by the reference numeral 100. The fritted cover sheet may generally comprise a transparent substrate, at least one mask and a sealing frit. The fritted coversheet and methods of forming and using the fritted cover sheet to seal a glass substrate will be described in more detail herein.

Figure 2A:
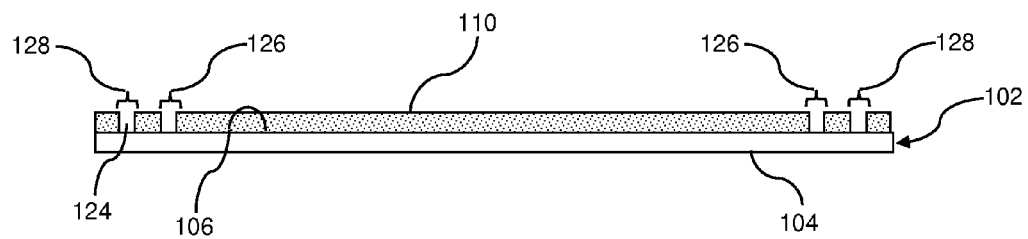
FIGS. 2A-2D depict cross sectional views of various stages of making a fritted cover sheet beginning with depositing a patterning material in 2A, depositing a masking material in 2B, removing the patterning material and a portion of the masking material in 2C, and depositing a sealing frit in 2D.
Figure 2B:
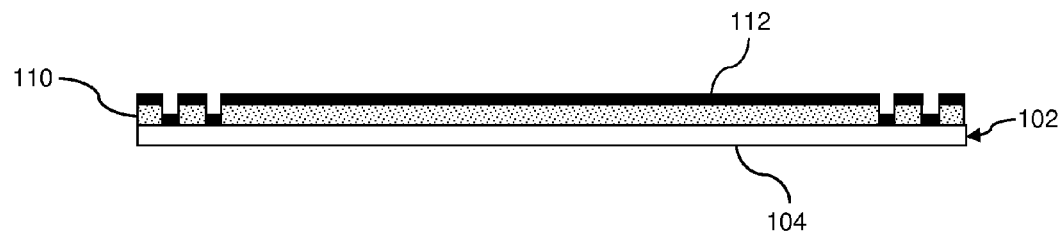
Figure 2C:
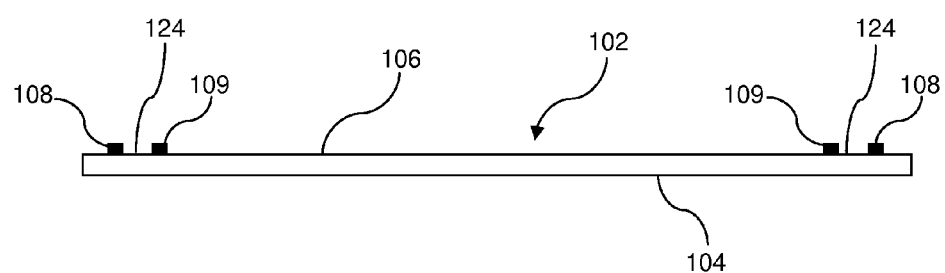
Figure 2D:
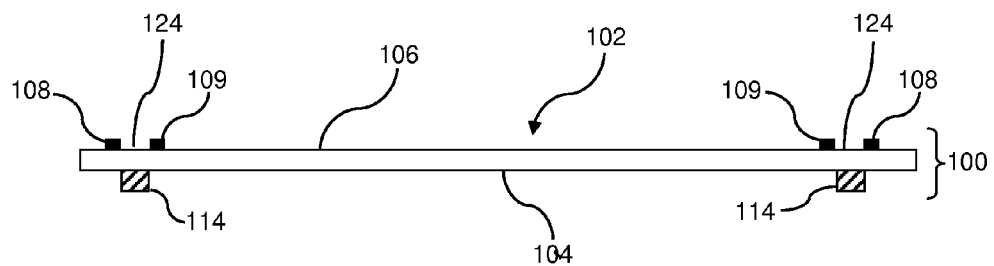

Referring to FIGS. 1 and 2D, one embodiment of a fritted cover sheet 100 is depicted. The fritted coversheet 100 generally comprises a transparent substrate 102, an inner mask 109, an outer mask 108 and a sealing frit 114. The term "transparent," as used herein, refers to a substrate which has a transmittance of at least about 90% for a particular wavelength of radiant energy incident on the substrate. For example, in one embodiment, the substrate 102 has a transmittance of at least about 90% for wavelengths of radiant energy from about 750 nm to about 950 nm which are used to heat the sealing frit 114. The transparent substrate 102 may be a glass substrate made of, for example, Eagle XG glass produced by Corning, Inc., or a similar glass material having a suitable transmittance at a wavelength of radiant energy used to heat the sealing frit 114 in a subsequent sealing process. The transparent substrate 102 may generally comprise a backing surface 106 and a sealing surface 104.

The inner mask 109 and outer mask 108 may be formed on either the backing surface or sealing surface of the transparent substrate 104 in a frame-like shape in the form of a line or band which closes on itself such that each of the inner mask 109 and outer mask 108 form a contiguous circuit. The inner mask 109 and outer mask 108 are spaced apart from one another such that an exposed portion 124 of the transparent substrate 102 is positioned between the inner mask and outer mask. In the embodiments shown in FIGS. 1 and 2D, the inner mask 109 and outer mask 108 are formed on the backing surface 106 of the transparent substrate 102. However, it will be understood that each of the inner mask 109 and outer mask may be formed on either the backing surface 106 or the sealing surface 104 of the transparent substrate.

The inner mask 109 and outer mask 108 are generally formed from a masking material which absorbs or reflects the radiant energy used to heat the sealing frit as the fritted cover sheet 100 is sealed to a substrate. In one embodiment, the masking material may comprise a metallic material which is reflective at the particular wavelength of radiant energy used to heat the sealing frit during a subsequent glass package sealing process. Such metallic materials may include, for example, aluminum, copper, chromium, molybdenum, gold, silver, platinum or any other suitable elemental or alloyed metallic material. The particular metallic material selected may depend on the characteristics of the radiant energy used in the subsequent glass package sealing process as different metallic materials may have different reflective properties. In alternative embodiments, the masking material may comprise a material which absorbs the radiant energy used to heat the sealing frit during a subsequent sealing process.

Still referring to FIGS. 1 and 2D, the sealing frit 114 may be positioned on the sealing surface 104 of the glass substrate 102 and positioned in the exposed portion 124 of the glass substrate 102 between the inner mask 109 and the outer mask 108 such that the sealing frit is adjacent to both the inner mask 109 and the outer mask 108. Accordingly, it should be understood that the sealing frit 114 generally has a frame-like shape in the form of a line or band which closes on itself to form a contiguous circuit thereby generally defining a perimeter on the sealing surface 104 of the glass substrate 102.

In one embodiment, the sealing frit 114 is a glass-based frit material which is deposited as a paste. The paste may generally comprise a glass powder(s), a binder (usually organic) and/or a volatile liquid vehicle such as a solvent. In one embodiment, the sealing frit 114 is formed from a low temperature glass frit that has a substantial optical absorption cross-section at a predetermined wavelength of radiant energy which matches or substantially matches the wavelength of radiant energy applied to the sealing frit 114 in a subsequent sealing operation. For example, the glass frit may contain one or more radiant energy absorbing ions chosen from the group including iron, copper, vanadium, neodymium and combinations thereof The glass frit may also be doped with a filler (e.g., an inversion filler or an additive filler) which modifies the coefficient of thermal expansion (CTE) of the glass frit such that the CTE of the glass frit more closely matches the CTE of both the substrate 102 and a glass substrate to which the fritted coversheet 100 is subsequently sealed. It will be understood that various compositions of glass frit may be used to produce the sealing frit 114. For example, some non-limiting examples of suitable frit compositions are disclosed in U.S. Pat. No. 6,998,776 entitled "Glass Package that is Hermetically Sealed with a Frit and Method of Fabrication" which is herein incorporated by reference.

Referring now to FIGS. 1 and 2A-2D, a method of forming a fritted coversheet for use in sealing a glass package such as, for example, a display device, may comprise depositing a patterning material 110 onto the transparent substrate 102. The patterning material may comprise any one of a variety of known patterning materials such as, for example, photo resist materials, ink, polymeric materials, inorganic materials or the like. In the embodiments shown and described herein, the patterning material is a paste comprising a glass frit. However, it should be understood that other suitable patterning materials may be used.

The patterning material 110 may be deposited on at least one of a sealing surface 104 of the transparent substrate 102 or a backing surface 106 of the transparent substrate 102. In the method for forming a fritted cover sheet 100 illustrated in FIGS. 2A-2D, the patterning material 110 is deposited on the backing surface 106 of the transparent substrate 102. The patterning material may be deposited onto the transparent substrate by any one of a variety of methods. For example, when the patterning material is a glass frit-based paste, the paste may be deposited on the transparent substrate by extruding the paste from an applicator (such as a nozzle, hollow needle or similar applicator), by screen printing, or by any other dispensing methods known in the art. However, it should be understood that, when the patterning material is a glass frit-based paste which is the same as or similar to the sealing frit subsequently deposited on the transparent substrate, it may be desirable to dispense the patterning material in the same manner as the sealing frit as this ensures the patterning material generally conforms to the geometry of the subsequently deposited sealing frit.

Referring to FIG. 2A, the patterning material 110 may be deposited on the transparent substrate 102 such that at least a portion of the transparent substrate 102 is exposed. For example, as shown in FIG. 2A, the patterning material 110 is deposited such that an interior channel 126 and an exterior channel 128 are formed in the patterning material 110. The interior and exterior channels 126, 128, which are used to form masks 108, 109 on the transparent substrate 102 (as will be described further herein), extend through the patterning material 110 to the backing surface 106 of the substrate 102. Each of the interior and exterior channels 126, 128 are generally formed as a contiguous channel which closes on itself such that the masks formed in such channels are also contiguous. The patterning material may be deposited such that the interior and exterior channels (and subsequent masks) have the desired configuration. For example, in the embodiment shown in FIGS. 1 and 2D the patterning material 110 is deposited such that each of the interior and exterior channels 126, 128 have a rectangular, frame-like shape with the interior channel 126 positioned within and spaced apart from the exterior channel 128.

While the embodiment shown in FIG. 2A depicts the patterning material 110 as being deposited to form two channels, (e.g., interior channel 126 and exterior channel 128), it should be understood that the patterning material may be deposited to form a single channel or more than two channels.

Further, while the embodiments shown and described herein indicate that the areas of the transparent substrate left exposed after deposition of the patterning material are channels, it should be understood that the patterning material may be deposited such that the exposed areas have other shapes and configurations. For example, in some embodiments, where the fritted cover sheet is used for sealing a glass package which is a top-emission display device, a single channel may be formed on the transparent substrate and a substantial area of the transparent substrate within the frame defined by the single channel may be left exposed.

When the patterning material 110 is a glass frit-based paste, the paste may generally comprise various glass powders, a binder and a volatile vehicle such as a solvent. The transparent substrate 102 may be heated after the patterning material 110 is deposited in order to dry the glass frit-based paste (e.g., drive off the volatile vehicle component of the paste). By removing the volatile vehicle the deposited patterning material has a more well-defined edge on the glass substrate which allows for deposition of a more well-defined mask, as will be described in more detail herein.

The patterning material 110 may ultimately be removed from the transparent substrate 102. Accordingly, it is desirable not to heat the glass frit-based paste sufficiently to sinter the glass frit as this may make subsequent removal of the frit difficult. Accordingly, to dry the glass frit-based paste, the transparent substrate 102 may be heated to a temperature of about 50° C. to about 300° C. for a period of time of greater than about 15 minutes (e.g., 15-20 minutes). Alternatively, after the glass frit-based paste is deposited, the glass frit-based paste may be dried in open air at room temperature for 15-20 minutes.

In an alternative embodiment, the patterning material 110 may be a polymer material, such as any one of a wide range of acrylic polymers. After the polymer material is deposited, the polymer material may be cured to set the polymer. For example, for some acrylic polymers, the polymer material may be cured by exposure to an ultraviolet light source. However, it will be understood that the particular curing technique utilized may vary depending on the particular polymer material selected for the patterning material.

Once the patterning material 110 has been deposited and, if appropriate, treated (e.g., heated or dried in the case of a glass-frit based patterning material or cured in the case of a polymer-based patterning material), a masking material 112 may be deposited overtop of the patterning material 110 and transparent substrate 102, as illustrated in FIG. 2B. Accordingly, when the patterning material 110 is deposited on the sealing surface 104 of the transparent substrate 102, the masking material 112 may be deposited over the patterning material 110 on the sealing surface 104. Likewise, when the patterning material 110 is deposited on the backing surface 106 of the transparent substrate 102, the masking material 112 may be deposited over the patterning material 110 on the backing surface 106. As described herein, the masking material 112 may comprise any material or combination of materials which either reflect or absorb the particular wavelength of radiant energy used to heat the sealing frit during subsequent sealing of a glass package with the fritted cover sheet 100. In the embodiments described herein, the masking material 112 is a metallic material such as, for example, aluminum or copper.

When the masking material 112 is a metallic material, as described herein, the masking material may be deposited by any conventional deposition method or technique, including, for example, vapor deposition or sputtering. It has been found that a more uniform deposition of the metallic material may be accomplished if the transparent substrate 102 with the deposited patterning material 110 is stationary during the deposition of the masking material 112.

In one embodiment (not shown), the masking material may be deposited in multiple layers of the same or differing materials. For example, depositing the masking material may include depositing a first layer of masking material and depositing a second layer of masking material over the first layer of masking material. In one embodiment, a first layer of aluminum may be deposited over the patterning material and transparent substrate. Thereafter, a second layer of copper may be deposited over the layer of aluminum. The aluminum layer may be used, for example, as an adhesion layer between the copper layer and the transparent substrate.

In some embodiments, when the masking material is a metallic material, a thin layer of SiO or $SiO_2$ may be deposited over the masking material after the masking material is deposited on the transparent substrate. The SiO or $SiO_2$ prevents oxidation of the metallic material which may lead to undue absorption by the mask of the radiant energy used to seal the glass package thereby causing the mask to overheat and ultimately degrade.

Referring now to FIG. 2C, in one embodiment, after the masking material 112 is deposited, the patterning material 110 and at least a portion of the masking material 112 are removed from the transparent substrate 102 leaving an inner mask 109 and an outer mask 108 on the transparent substrate 102. In one embodiment, such as when the patterning material 110 is a glass frit-based material, the patterning material 110 and a portion of the masking material 112 may be removed by washing the transparent substrate 102. For example, the transparent substrate may be washed in a solvent, such as acetone, and gently wiped to remove the paste and a portion of the masking material deposited overtop of the patterning material. Alternatively, a pressurized spray may be used to remove the patterning material and at least a portion of the masking material. Other methods for removing the patterning material and at least a portion of the masking material may be used as appropriate.

In another embodiment, such as when the patterning material 110 is a polymer, the transparent substrate 102, including any materials deposited on the transparent substrate, may be heated to facilitate removal of the polymer material. The heating schedule and temperatures used to remove the polymer may vary depending on the type of polymer utilized. However, such parameters may be determined easily and without undue experimentation.

Referring now to FIGS. 1 and 2C, after the patterning material 110 and at least a portion of the masking material 112 have been removed, at least one mask comprising the masking material 112 is left remaining on the transparent substrate 102. The at least one mask may be generally frame-shaped in the form of a line or a band which closes on itself to form a contiguous circuit, as described hereinabove. In the embodiment shown in FIG. 2C, the at least one mask comprises an outer mask 108 and an inner mask 109 with each of the outer and inner masks 108, 109 being generally frame-shaped as described above. The outer mask 108 and the inner mask 109 are spaced apart from one another with an exposed portion 124 positioned between the outer mask 108 and the inner mask 109 on the backing surface 106 of the transparent substrate 102.

As shown in FIG. 2D, after the patterning material 110 and at least a portion of the masking material 112 have been removed from the transparent substrate 102, a sealing frit 114 may be deposited on the sealing surface 104 of the transparent substrate 102 thereby forming the fritted cover sheet 100. The sealing frit, which is initially deposited on the substrate as a paste, may be deposited by extruding the paste from an applicator (such as a nozzle, hollow needle or similar applicator), by screen printing, or by any other dispensing methods known in the art.

The deposited sealing frit 114 may be generally frame-shaped in the form of a line or a band which closes on itself to form a contiguous circuit. Accordingly, it should be understood that the sealing frit 114 generally defines a perimeter on the transparent substrate 102. The sealing frit 114 may be positioned between the inner mask 109 and the outer mask 108 such that the inner mask 109 and outer mask 108 are adjacent to the sealing frit 114. For example, as depicted in the embodiment of the fritted cover sheet 100 shown in FIG. 2D, the sealing frit 114 may be deposited on the sealing surface 104 of the transparent substrate 102 while the inner mask 109 and outer mask 108 are located on the backing surface 106 of the glass substrate. The sealing frit 114 is positioned between and adjacent to the inner mask 109 and outer mask 108 albeit on the opposite side of the transparent substrate 102. However, it should be understood that other relative orientations of the sealing frit 114, inner mask 109 and outer mask 108 may be possible. For example, in one embodiment, the sealing frit 114, inner mask 109 and outer mask 108 may all be deposited on the sealing surface 104 of the transparent substrate 102.

The sealing frit 114 is positioned on the sealing surface 104 such that, when radiant energy is incident on the exposed portion 124 on the backing surface 106, the radiant energy passes through the transparent substrate 102 and onto the sealing frit 114 thereby heating the sealing frit 114. The sealing frit 114 may be deposited on the substrate such that the inner mask 109 is positioned adjacent to the sealing frit 114 and within the perimeter defined by the sealing frit 114 on either the sealing surface 104 or the backing surface 106 of the transparent substrate 102.

In the embodiments described herein, the sealing frit 114 is deposited on the substrate 102 after the inner mask 109 and outer mask 108 have been formed on the substrate 102. However, it should be understood that in other embodiments (not shown) the inner mask 109 and outer mask 108 may be formed on the substrate 102 after the sealing frit 114 has been deposited on the substrate 102.

Further, while FIGS. 1 and 2D depict a fritted cover sheet 100 which includes an inner mask 109 and an outer mask 108 located on the backing surface 106 of the transparent substrate, it should be understood that, in alternative embodiments, the inner mask 109 and outer mask 108 may be positioned on the sealing surface 104.

Figure 3A:
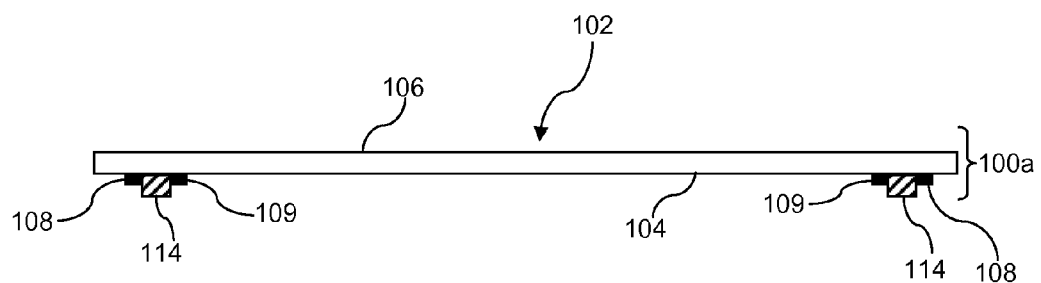
FIGS. 3A-3C depict three different embodiments of fritted cover sheets made according to the methods shown and described herein.

Referring to FIG. 3A, by way of example, an alternative embodiment of a fritted cover sheet 100a is depicted in which the inner mask 109 and outer mask 108 are located on the sealing surface 104 of the transparent substrate 102 along with the sealing frit 114. The inner mask 109 and outer mask 108 may be formed as described herein.

Figure 3B:
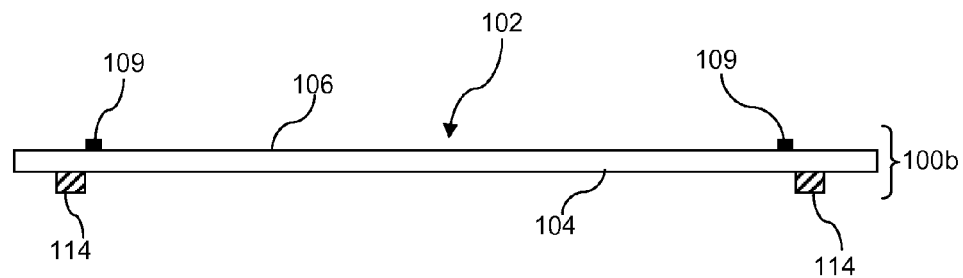

Further, while FIGS. 1 and 2D depict a fritted cover sheet 100 comprising both an inner mask 109 and an outer mask 108, it should be understood that, in alternative embodiments, the fritted cover sheet 100 may comprise a single mask (e.g., either an outer mask or an inner mask). For example, FIG. 3B depicts one embodiment of a fritted cover sheet 100b which comprises an inner mask 109 and a sealing frit 114. The sealing frit 114 is deposited such that the inner mask 109 is positioned adjacent to the sealing frit 114 and within the perimeter defined by the sealing frit 114. In the embodiment shown in FIG. 3B the inner mask 109 is located on the backing surface 106 of the transparent substrate 102. However, it should be understood that in other embodiments (not shown) the inner mask may be positioned on the sealing surface of the transparent substrate and within the perimeter defined by the sealing frit.

Figure 3C:
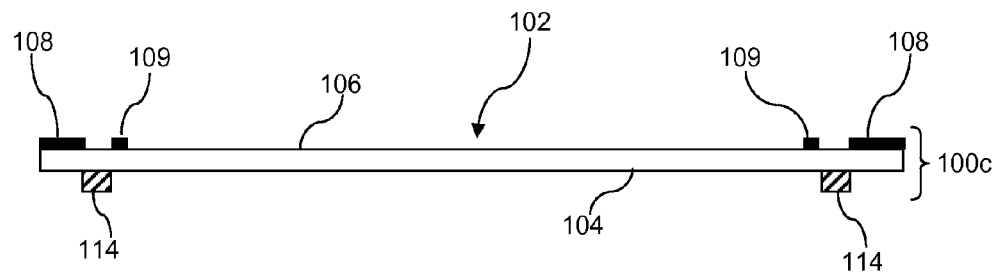

Referring to FIG. 3C, another embodiment of a fritted cover sheet 100c is depicted. In this embodiment, the outer mask 108 is spaced apart from the inner mask 109 and extends to the edge of the transparent substrate 102. This configuration of the inner mask 109 and outer mask 108 may be obtained by spacing the patterning material apart from the edge of the transparent substrate and forming a single, frame-shaped channel in the patterning material during deposition of the patterning material. Accordingly, it should be understood that various other configurations and/or shapes of the inner mask and outer mask may be achieved by depositing the patterning material to form a pattern of the desired configuration and/or shape.

Figure 4A:
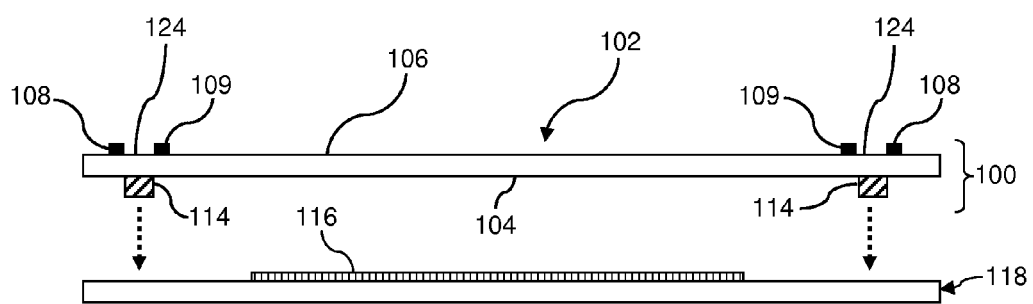
FIGS. 4A-4B depict cross sectional views of a fritted cover sheet according to one embodiment shown and described herein being positioned on and sealed to a substrate comprising an OLED device to form a display device.
Figure 4B:
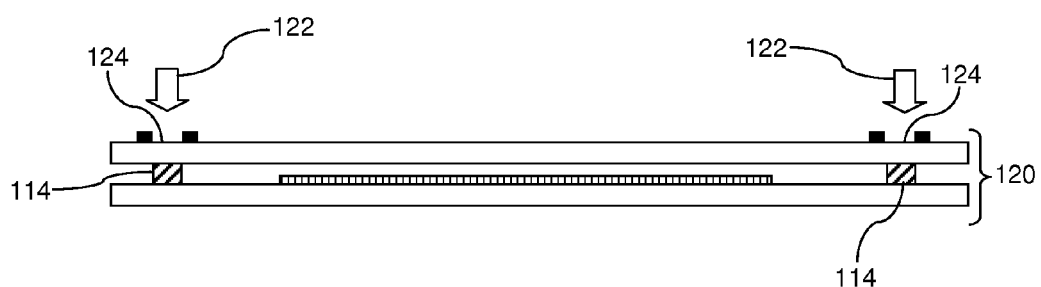

Referring now to FIGS. 4A and 4B, the fritted coversheets described herein may be used to seal a glass substrate and thereby form a sealed glass package. In the embodiment shown in FIGS. 4A and 4B the fritted cover sheet 100 is used to seal a glass substrate 118 having an electroluminescent device 116 positioned thereon to form a glass substrate which, in this embodiment, is a display device 120. For example, the electroluminescent device may be an organic light emitting diode ("OLED").

The fritted coversheet 100 is first positioned on the glass substrate 118 (e.g., the OLED substrate) such that the electroluminescent device 116 is positioned between the sealing surface 104 of the fritted cover sheet 100 and the glass substrate 118. With the fritted coversheet 100 in this position the electroluminescent device 116 is positioned within the perimeter or frame defined by the sealing frit 114. Thereafter, the sealing frit 114 is irradiated with a suitable radiant energy 122 (represented by block arrows) by directing the radiant energy 122 through the exposed portion 124 of the fritted coversheet 100 between the inner mask 109 and outer mask 108. It should be understood that, as the radiant energy 122 is directed through the exposed portion 124 of the fritted coversheet 100, the inner mask 109 and outer mask 108 may also be irradiated by the radiant energy 122 and that the inner mask 109 and outer mask 108 reflect and/or absorb the radiant energy 122. For example, when the masking material used to form the inner mask 109 and outer mask 108 is a metallic material such as aluminum, the inner mask 109 and outer mask 108 may be reflective. In some embodiments, the radiant energy 122 may be a laser beam having a wavelength which will be absorbed by the sealing frit 114. For example, a laser beam having a suitable wavelength may be traversed over the exposed portion 124 of the fritted coversheet 100 to irradiate and heat the sealing frit 114.

In other embodiments (not shown), the radiant energy may emanate from a broadband infrared source which irradiates all or a substantial portion of the fritted coversheet simultaneously. In such embodiments the resulting display device may be a top emission device and the inner mask extends across the center portion of the fritted coversheet such that the electroluminescent device is protected from the applied radiant energy.

The appropriate source and manner of irradiating the sealing frit 114 will depend upon the frit composition to be heated and melted as well as the characteristics of the glass package which is being sealed (e.g., whether or not heat sensitive organic materials are used in the manufacture of the glass package). The radiant energy transmitted through the exposed portion 124 and on to the sealing frit 114 heats and melts the sealing frit 114 thereby sealing the fritted coversheet 100 to the glass substrate 118 to form a hermetically sealed glass package such as, in this example, display device 120.

While the examples and embodiments described herein relate to a fritted cover sheet which comprises masks and sealing frits for sealing a single glass package, it should be understood that the fritted cover sheet may be formed with multiple masks and sealing frits for sealing multiple (e.g., two or more) glass packages arranged on a single glass substrate which may prove advantageous for large scale production of sealed glass packages. For example, FIG. 5 shows one embodiment of a fritted cover sheet 100d which comprises a plurality of masks (e.g., outer masks 109a, 109b and inner masks 108a, 108b) and sealing frits (e.g., sealing frits 114a and 114b) for individually sealing two electroluminescent devices 116 positioned on a single glass substrate 118.

Figure 5:
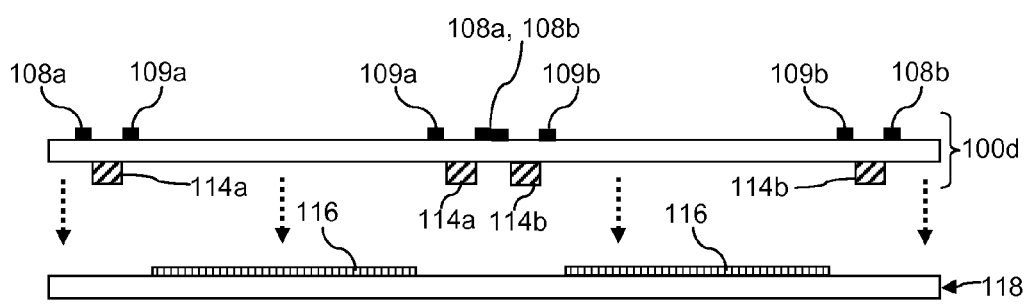
FIG. 5 depicts a cross sectional view of a fritted cover sheet for sealing multiple glass packages on a single glass substrate according to one or more embodiments shown and described herein.

Further, while FIGS. 4A-4B and 5 depict the formation of a display device (such as an OLED display) using the fritted cover sheets described herein, it should be understood that the fritted cover sheets with sealing frits and masks formed as described herein may be used to seal other types of glass packages. Such glass packages may include, for example, photo-voltaic devices and similarly constructed glass packages which include a glass substrate sealed with a fritted cover sheet.

It should be emphasized that the above-described embodiments and particularly any "preferred" embodiments, are merely possible examples of implementations and merely set forth for a clear understanding of the principles of the invention. Various modifications and variations can be made to the embodiments described herein without departing from the spirit and scope of the claimed subject matter. Thus it is intended that the specification cover the modifications and variations of the embodiments described herein provided such modifications and variations come within the scope of the appended claims and their equivalents.

What is claimed is:

1. A method for forming a fritted cover sheet for sealing a glass package, the method comprising:
    providing a transparent substrate comprising a sealing surface and a backing surface;
    depositing a patterning material on one of the sealing surface or the backing surface of the transparent substrate to form an inner channel spaced apart from an outer channel;
    depositing a masking material over the patterning material and the substrate;
    removing the patterning material and at least a portion of the masking material from the substrate to form an inner mask spaced apart from an outer mask on one of the sealing surface of the substrate or the backing surface of the substrate; and
    forming a sealing frit on the sealing surface of the substrate such that the inner mask is positioned adjacent a perimeter defined by the sealing frit.

2. The method of claim 1 wherein the sealing frit is formed between the inner mask and the outer mask.

3. The method of claim 1 wherein the depositing the patterning material comprises extruding the patterning material from a nozzle.

4. The method of claim 1 wherein the depositing the masking material comprises screen printing.

5. The method of claim 1 wherein the depositing the masking material comprises depositing multiple layers of masking material.

6. The method of claim 1 wherein the depositing the masking material comprises vacuum depositing the masking material.

7. The method of claim 1 wherein the patterning material comprises a glass frit-based paste.

8. The method of claim 1 wherein the patterning material comprises a polymeric material.

9. The method of claim 1 wherein the masking material is a metallic material.

10. A method for forming a glass package comprising:
    providing a first transparent substrate and a second transparent substrate;
    depositing a patterning material on one of the sealing surface or the backing surface of the first transparent substrate to form an inner channel spaced apart from an outer channel;
    depositing the masking material over the patterning material and the first transparent substrate;
    removing the patterning material and at least a portion of the masking material from the first transparent substrate to form an inner mask spaced apart from an outer mask on one of a sealing surface of the first transparent substrate or a backing surface of the first transparent substrate;
    forming a sealing frit on the sealing surface of the first transparent substrate such that the inner mask is located within a perimeter defined by the sealing frit;
    aligning the first transparent substrate on the second transparent substrate such that the sealing frit is disposed between the first transparent substrate and the second transparent substrate; and
    directing radiant energy onto the sealing frit through the backing surface of the first transparent substrate to heat the sealing frit and thereby hermetically seal the first transparent substrate to the second transparent substrate.

11. The method of claim 10 wherein the patterning material comprises a frit paste.

12. The method of claim 10 wherein the second transparent substrate comprises at least one electroluminescent device and, when the first transparent substrate is positioned on the second substrate, the electroluminescent device is positioned within the perimeter defined by the sealing frit.

13. The method of claim 10 wherein the masking material comprises a metallic material.

14. The method of claim 7 wherein the depositing a patterning material comprises curing the patterning material on the substrate by drying the patterning material at room temperature without sintering the patterning material.

15. The method of claim 11 wherein the depositing a patterning material comprises curing the patterning material on the first transparent substrate by drying the patterning material at room temperature without sintering the patterning material.

* * * * *